(12) United States Patent
Hioka et al.

(10) Patent No.: US 9,070,434 B2
(45) Date of Patent: Jun. 30, 2015

(54) SEMICONDUCTOR DEVICE

(75) Inventors: Takeshi Hioka, Kanagawa-ken (JP);
Yoshihisa Iwata, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 268 days.

(21) Appl. No.: 13/607,529

(22) Filed: Sep. 7, 2012

(65) Prior Publication Data
US 2013/0258796 A1 Oct. 3, 2013

(30) Foreign Application Priority Data

Mar. 29, 2012 (JP) ................ P2012-075404

(51) Int. Cl.
*G11C 7/22* (2006.01)
*G11C 5/06* (2006.01)
*G11C 5/14* (2006.01)
*G11C 16/10* (2006.01)

(52) U.S. Cl.
CPC .............. *G11C 7/222* (2013.01); *G11C 5/063* (2013.01); *G11C 5/145* (2013.01); *G11C 16/10* (2013.01)

(58) Field of Classification Search
CPC ........ G11C 7/222; G11C 5/063; G11C 5/145; G11C 16/10
USPC ............ 365/149, 189.09, 189.11, 226, 51, 63
See application file for complete search history.

(56) References Cited

U.S. PATENT DOCUMENTS

| | | | |
|---|---|---|---|
| 4,839,787 A * | 6/1989 | Kojima et al. | 363/60 |
| 5,301,097 A * | 4/1994 | McDaniel | 363/60 |
| 5,599,724 A | 2/1997 | Yoshida | |
| 5,643,804 A | 7/1997 | Arai et al. | |
| 5,707,885 A | 1/1998 | Lim | |
| 5,745,335 A | 4/1998 | Watt | |
| 6,069,518 A * | 5/2000 | Nakai et al. | 327/535 |
| 6,069,536 A | 5/2000 | Oh | |
| 7,264,985 B2 | 9/2007 | Chung et al. | |
| 7,348,624 B2 | 3/2008 | Sakaguchi et al. | |
| 7,910,973 B2 | 3/2011 | Sakaguchi et al. | |

(Continued)

FOREIGN PATENT DOCUMENTS

| | | |
|---|---|---|
| JP | S62-000107 | 1/1987 |
| JP | H06-338602 | 6/1994 |

(Continued)

OTHER PUBLICATIONS

Office Action issued Aug. 17, 2010 in Japanese Application No. 2008-067544.

(Continued)

*Primary Examiner* — J. H. Hur
(74) *Attorney, Agent, or Firm* — Patterson & Sheridan, LLP

(57) ABSTRACT

A semiconductor device comprises a stacked layer memory block and associated peripheral circuits, such as a booster circuit, in stacked layer arrangements. The booster circuit includes plural rectifier cells that are series-connected and plural first capacitors. The plural first capacitors receive a first clock signal on one end, and the other ends thereof are each connected to one end of a different rectifier cell. Each first capacitor is composed of plural first conductive layers that are arrayed with a set pitch perpendicular to the substrate. Either the even numbered or the odd numbered first conductive layers are supplied with the first clock signal. The other of the even numbered or odd numbered first conductive layers are each individually connected to one end of a different rectifier cell.

20 Claims, 13 Drawing Sheets

(56) References Cited

U.S. PATENT DOCUMENTS

| | | |
|---|---|---|
| 2006/0091443 A1 | 5/2006 | Ueda |
| 2007/0158736 A1 | 7/2007 | Arai et al. |
| 2007/0230090 A1 | 10/2007 | Kumagai |
| 2007/0252201 A1 | 11/2007 | Kito et al. |
| 2008/0073635 A1 | 3/2008 | Kiyotoshi et al. |
| 2008/0084728 A1 | 4/2008 | Sakuma et al. |
| 2008/0128780 A1 | 6/2008 | Nishihara et al. |
| 2008/0173926 A1 | 7/2008 | Schuler et al. |
| 2009/0230449 A1* | 9/2009 | Sakaguchi et al. ............ 257/298 |

FOREIGN PATENT DOCUMENTS

| | | |
|---|---|---|
| JP | H08-264721 | 10/1996 |
| JP | H10-032269 | 2/1998 |
| JP | 2000-514243 | 10/2000 |
| JP | 2001-320016 | 11/2001 |
| JP | 2002-110825 | 4/2002 |
| JP | 2002-141469 | 5/2002 |
| JP | 2004-200504 | 7/2004 |
| JP | 2006-186038 | 7/2006 |
| JP | 2007-266143 | 10/2007 |
| JP | 2007-311566 | 11/2007 |
| JP | 2007-317874 | 12/2007 |
| JP | 2009-224565 | 10/2009 |
| WO | WO98/00871 | 1/1998 |

OTHER PUBLICATIONS

H. Tanaka, et al., "Bit Cost Scalable Technology with Punch and Plug Process for Ultra High Density Flash Memory", Symposium on VLSI Technology Digest of Technical Papers, 2007, pp. 14-15.

\* cited by examiner

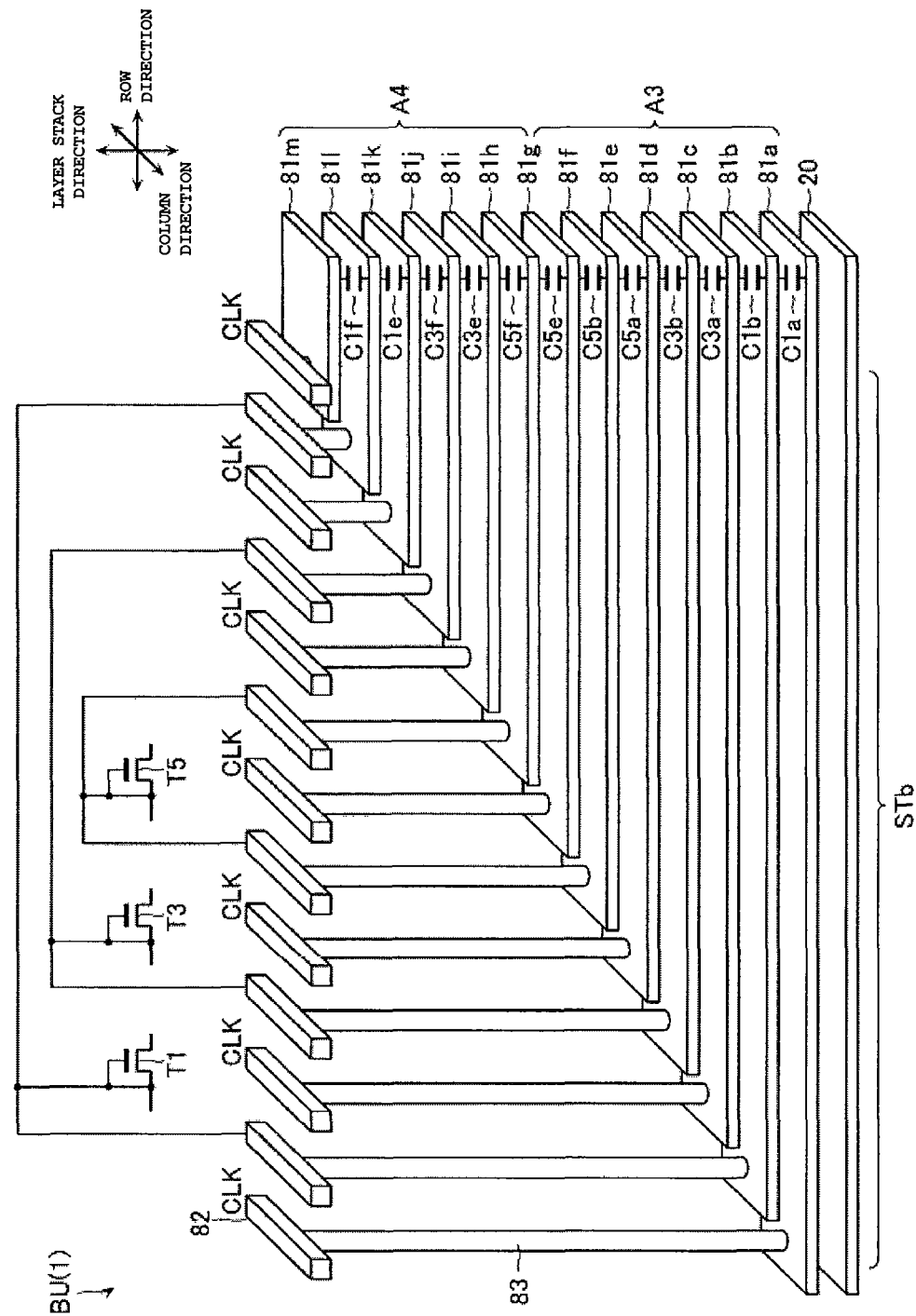

SEMICONDUCTOR DEVICE

CROSS-REFERENCE TO RELATED APPLICATION

This application is based upon and claims the benefit of priority from Japanese Patent Application No. 2012-075404, filed Mar. 29, 2012; the entire contents of which are incorporated herein by reference.

FIELD

Embodiments described herein relate to a semiconductor device.

BACKGROUND

In recent years, in order to increase the density of memory, many memory cell arrays that arrange memory cells three-dimensionally have been proposed.

These three-dimensional memory cell arrays also require peripheral circuitry, including booster circuits and oscillating circuits, etc. It is also desirable for the area occupied peripheral circuitry similarly to be reduced.

DESCRIPTION OF THE DRAWINGS

FIG. 9 is a perspective that shows the booster unit of a third embodiment.

DETAILED DESCRIPTION

In general, we explain the semiconductor device by reference to embodiments depicted in the diagrams.

A semiconductor device that reduces the occupied area of the peripheral circuitry is described.

A semiconductor device that involves one mode, possesses a booster circuit. The booster circuit possesses plural rectifier cells that are series-connected and plural first capacitors. Plural first capacitors receive the first clock signal on one end and the other ends are each connected to one end of different rectifier cells. The first capacitor is composed of capacities between plural first conductive layers that are arrayed with a set pitch perpendicularly to the substrate. One of the either even numbered or odd numbered first conductive layers that is lined perpendicularly to the substrate is supplied with the first clock signal. The other of the either even numbered or odd numbered first conductive layer that is lined perpendicularly to the substrate is, each, connected to one end of different rectifier cells.

Embodiment 1

Figure 1:
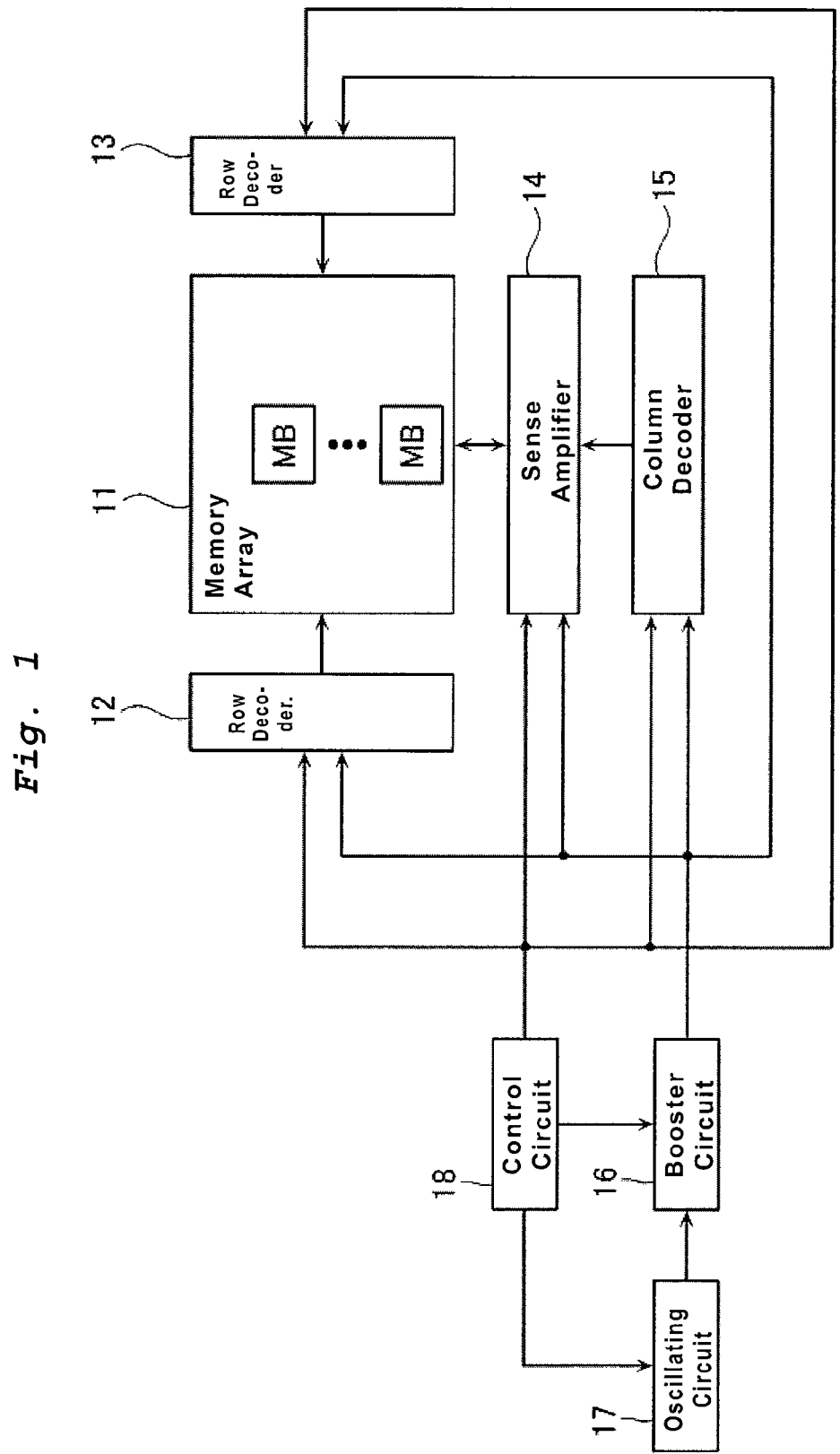
FIG. 1 is a block diagram of a semiconductor device according to a first embodiment.

FIG. 1 is a block diagram of a semiconductor device that pertains to the first embodiment.

The semiconductor device shown in FIG. 1 possesses a memory cell array 11, row decoders 12, 13, sense amplifier 14, column decoder 15, booster circuit 16, oscillating circuit 17, and a control circuit 18. This embodiment includes the memory cell array 11 with the laminate structure shown in FIGS. 3 and 4, discussed below, which reduces its occupied area. Furthermore, this embodiment includes the booster circuit 16 (booster unit BU) with the arrangement shown in FIG. 6, and the laminate structure shown in FIGS. 7A and 7B which reduces its occupied area.

The memory cell array 11 is composed of a plural memory block (MB). A memory block (MB) is the smallest unit that can be batch erased when performing a data erase action.

The row decoders 12 and 13 shown in FIG. 1 decode the row address signal and selects a word line (as will hereinafter be described in detail). The sense amplifier 14 reads data from the memory cell array 11. Column decoder 15 decodes the column address signal and selects a bit line (as will hereinafter be described in detail).

The booster circuit 16 produces the high voltage necessary for writing, reading and erasing and supplies it to the row decoders 12 and 13, sense amplifier 14, and the column decoder 15. The oscillating circuit 17 produces the clock signal, and supplies that clock signal to the booster circuit 16. The control circuit 18 controls the row decoders 12 and 13, sense amplifier 14, column decoder 15, booster circuit 16, and the oscillating circuit 17.

Figure 2:
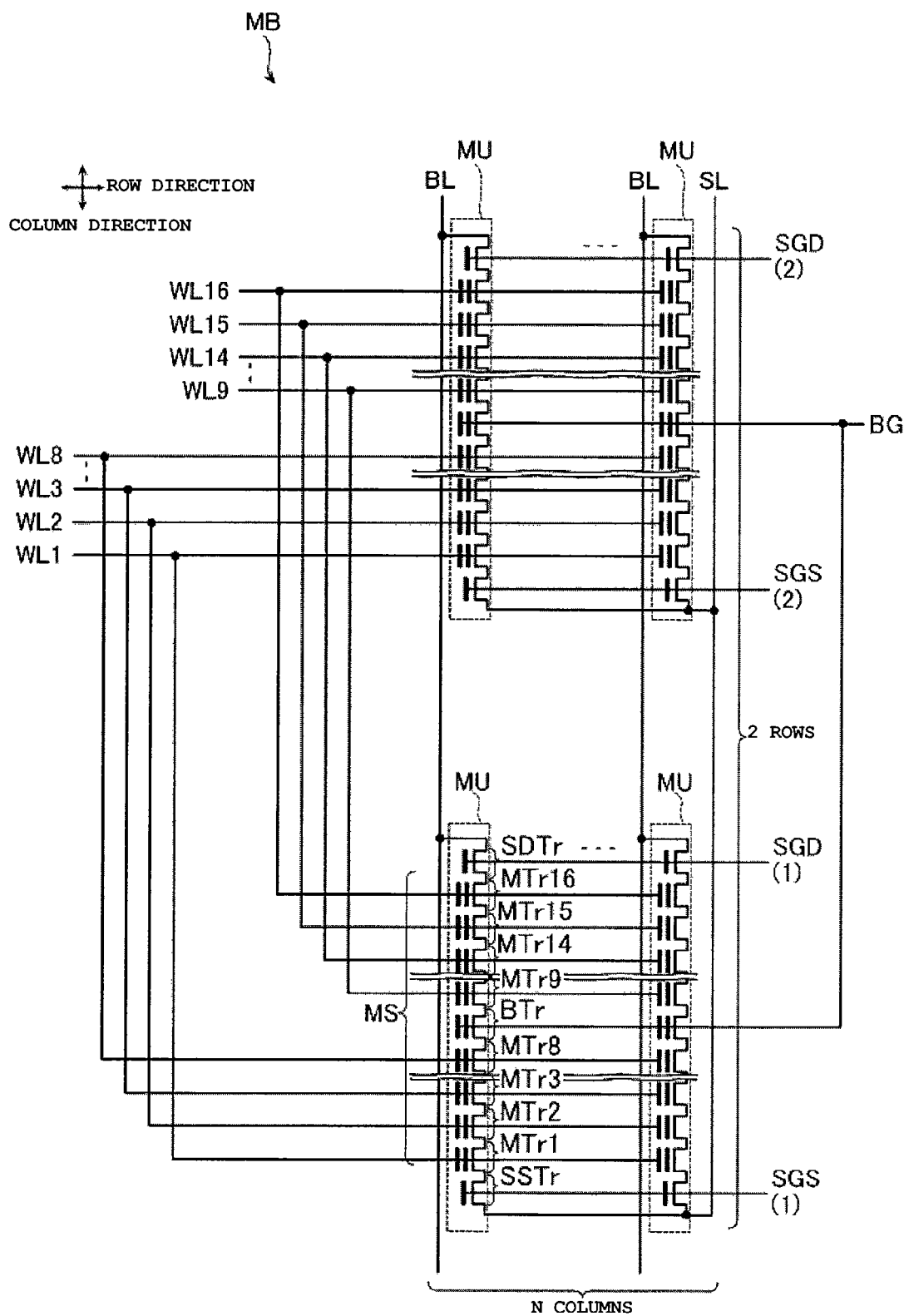
FIG. 2 is a circuit diagram that shows a memory block (MB) of the first embodiment.

Next, the composition of the memory block (MB) is described by referencing FIG. 2. The memory block (MB) possesses plural bit lines (BL), source lines (SL), and plural memory units (MU) that are connected to those bit lines (BL) and source lines (SL).

The memory block (MB) possesses a memory unit (MU) that is shown arrayed in a matrix of n columns and 2 rows, but other arrangements are possible and the invention is not so limited.

One end of the memory unit (MU) is connected to the bit line (BL), and the other end of the memory unit (MU) is connected to the source line (SL). Plural bit lines (BL) extend in the column direction with a set pitch in the row direction.

The memory unit (MU) possesses a memory string (MS), source select transistor (SSTr), and the drain select transistor (SDTr).

Figure 3:
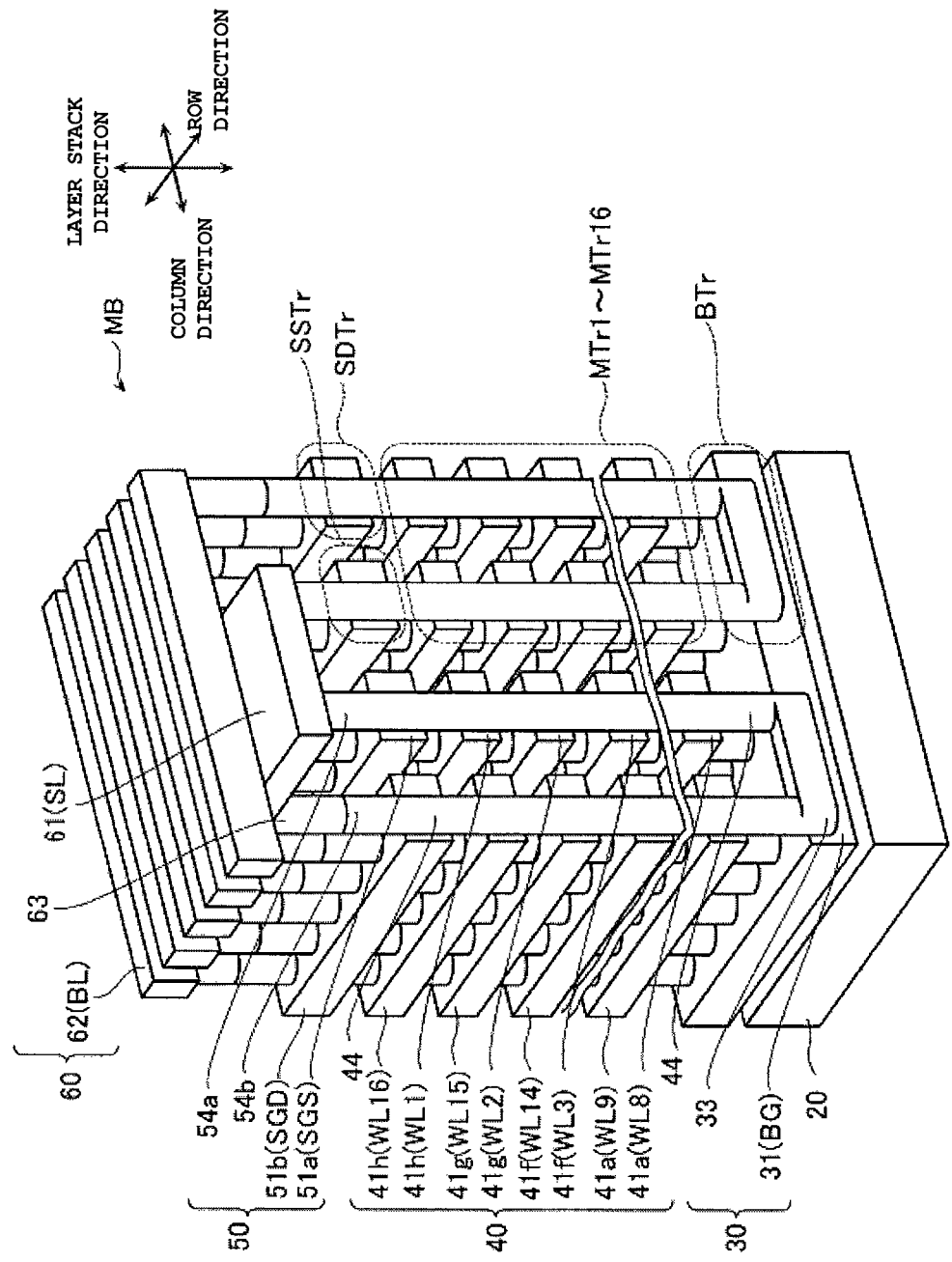
FIG. 3 is a perspective that shows the laminate structure of a memory cell array of the first embodiment.

The memory string (MS) possesses memory transistors (MTr) 1-16 (memory cell) that are series connected, and a back gate transistor (BTr). Memory transistors (MTr) 1-8 are mutually series-connected, and MTr 9-16 are also mutually series-connected. The back gate transistor (BTr) is connected between memory transistor MTr8 and memory transistor MTr9. As shown in FIG. 3, memory transistors MTr 1-16 are arrayed three-dimensionally in the row direction, column direction, and the layer stack direction (perpendicular to the substrate). The number of memory transistors within a memory string (MS) is not limited to 16; it can be more or less without departing from the present disclosure.

Memory transistors MTr 1-16, retain data by accumulating charge in a charge accumulation layer. The back gate transistor (BTr) is put in a conductive state, at least when the memory string (MS) is selected as an action target.

Within the memory block (MB) the gates of the memory transistors MTr 1-16 are each mutually connected with the corresponding word lines (WL) 1-16. The back gate transistor BTr is mutually connected to one back gate line (BG).

The drain of the source select transistor (SSTr) is connected to the source of the memory string (MS). The source of the source select transistor (SSTr) is connected to the source line (SL). N gates of the source select transistor (SSTr) are mutually connected to one source select gate line SGS (1) or SGS (2) based on their position within the memory block. The description that follows may not always differentiate between the source select gate lines SGS (1) and (2) and may collectively refer to them source select gate line (SGS).

The source of the drain select transistor (SDTr) is connected to the drain of the memory string (MS). The drain of the drain select transistor (SDTr) is connected to the bit line (BL). The gates of the source select transistor (SSTr) are mutually connected to one drain select gate line SGD (1) or SGD (2) based upon their position in within the memory block. The description that follows may not always differentiate between the drain select gate line SGD (1) and (2) and may collectively call them drain select gate line (SGD).

Figure 4:
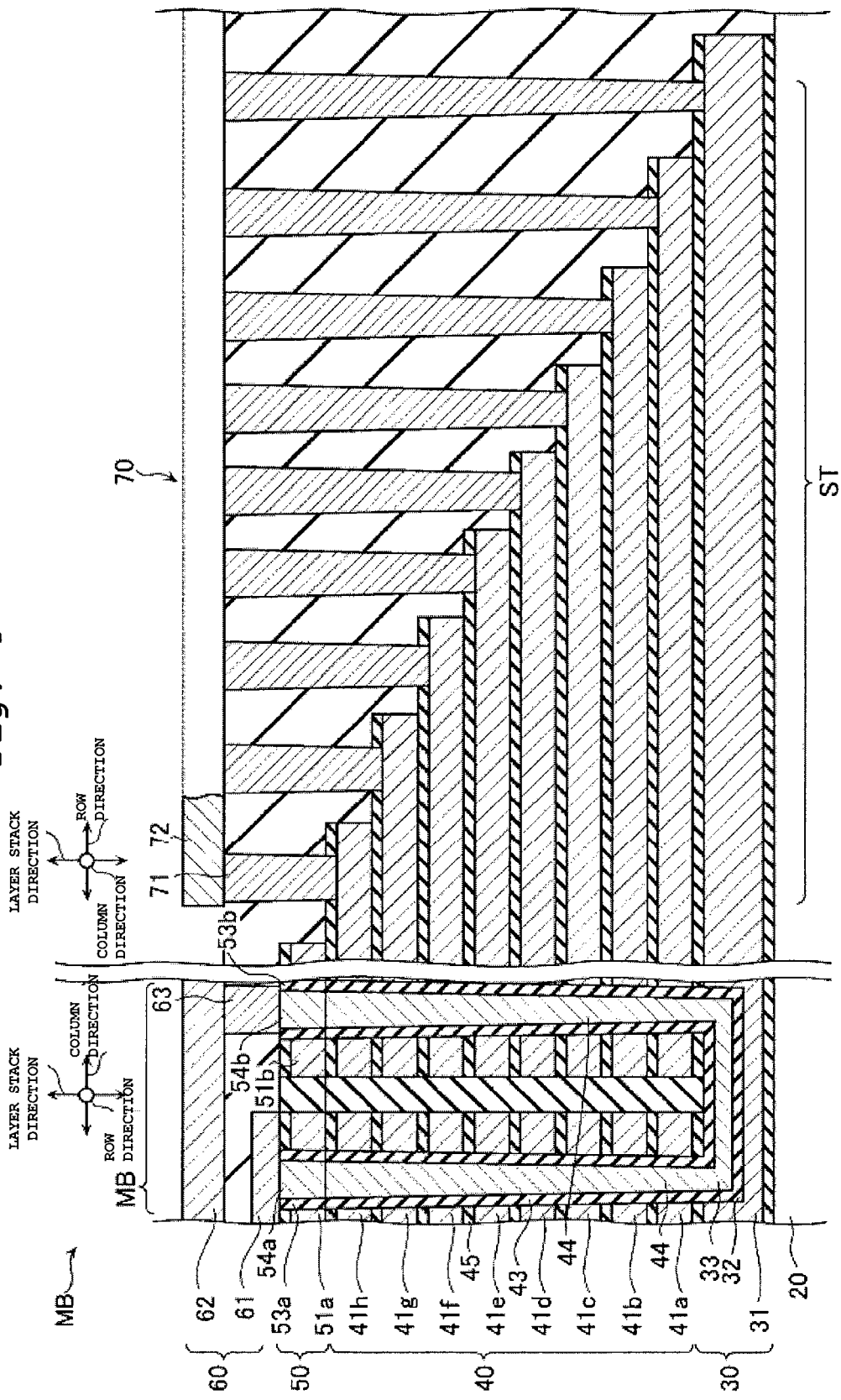
FIG. 4 is a cross-section diagram that shows the laminate structure of the memory cell array of the first embodiment.

Next, the laminate or stacked layer structure of the memory block (MB) is described by referencing FIGS. 3 and 4. The memory block (MB) possesses a back gate layer 30, a memory layer 40, a select transistor layer 50, and an interconnect layer 60, that are sequentially stacked above the substrate 20. The back gate layer 30 functions as a back gate transistor (BTr). The memory layer 40 functions as memory transistors MTr1-MTr16. The select transistor layer 50 functions as the drain select transistor (SDTr) and the source select transistor (SSTr). The interconnect layer 60 functions as the source line (SL) and the bit line (BL).

The back gate layer 30 possesses the back gate conductive layer 31. The back gate conductive layer 31 functions as the gate for the back gate line (BG) and the back gate transistor (BTr). The back gate conductive layer 31 is formed as a two-dimensional sheet in the row direction and column direction parallel to the substrate 20. The back gate conductive layer 31 is, for example, composed of polysilicon (poly-Si).

The back gate layer 30, as shown in FIG. 3 and FIG. 4, possesses the back gate insulating layer 32 and the back gate semiconductor layer 33. The back gate insulating layer 32 is composed so that it can accumulate charge. The back gate insulating layer 32 is placed between the back gate semiconductor layer 33 and the back gate conductive layer 31. The back gate insulating layer 32 is composed of, for example, silicon oxide ($SiO_2$), silicon nitride (SiN) and silicon oxide ($SiO_2$).

The back gate semiconductor layer 33 functions as the body (channel) of the back gate transistor (BTr). The back gate semiconductor layer 33 is formed so that it encases the back gate conductive layer 31 via the back gate insulating layer 32. The back gate semiconductor layer 33 is composed of, for example, polysilicon (poly-Si).

The memory layer 40 is formed in a layer above the back gate layer 30. The memory layer 40 in this example possesses 8 layers of the word line conductive layers 41a-41h. The word line conductive layer 41a functions as both the word line WL8 and the gate of the memory transistor MTr8. Also, the word line conductive layer 41a also functions as both the word line WL9 and the gate of the memory transistor MTr9. Similarly, the word line conductive layers 41b-41h, individually, function as the word lines WL1-WL7 and the gate of memory transistors MTr1-MTr7. Also each word line conductive layers 41b-41h also function as the word lines WL10-WL16 and the gate of memory transistors MTr10-MTr16, respectively.

The word line conductive layers 41a-41h are layer stacked with an interlaminar insulating layer 45 above and below each conductive layer. The word line conductive layers 41a-41h extend longitudinally in the row direction. The word line conductive layers 41a-41h are composed of, for example, polysilicon (poly-Si).

The memory layer 40 possesses a memory gate insulating layer 43 and a memory columnar semiconductor layer 44. The memory gate insulating layer 43 is composed so that it can accumulate charge. The memory gate insulating layer 43 is placed between the memory columnar semiconductor layer 44 and the word line conductive layers 41a-41h. The memory gate insulating layer 43 is composed of, for example, silicon oxide ($SiO_2$), silicon nitride (SiN), and silicon oxide ($SiO_2$).

The memory columnar semiconductor layer 44 functions as the body (channel) for the memory transistor MTr1-MTr16. The memory columnar semiconductor layer 44 penetrates the word line conductive layers 41a-41h and the interlaminar insulating layer 45, and extends in a direction perpendicular to substrate 20. A pair of memory columnar semiconductor layers 44 is formed such that each column of the pair is adjacent in the column direction. The pair of the memory columnar semiconductor layers 44 and the back gate semiconductor layer 33 that connects its lower ends, function as the body (channel) for the memory string (MS), and is formed into a U-shape when seen from the row direction. The memory columnar semiconductor layer 44 is composed of, for example, polysilicon (poly-Si).

Back gate layer 30 is comprised of the back gate conductive layer 31, in contact with the back gate insulating layer 32, which encloses the sides and the lower surface of the back gate semiconductor layer 33.

Memory layer 40 is comprised of word line conductive layers 41a-41h, in contact with the memory gate insulating layer 43, which encloses the sides of the memory columnar semiconductor layer 44.

The select transistor layer 50 has the source side conductive layer 51a and the drain side conductive layer 51b. The source side conductive layer 51a functions as both the source select gate line (SGS) and the gate of the source select transistor (SSTr). The drain side conductive layer 51b functions as both the drain select gate line (SGD) and the gate of the drain select transistor (SDTr).

The source side conductive layer 51a is formed near an upper portion of one of the pair of memory columnar semiconductor layer 44. Drain side conductive layer 51b is on the same layer as source side conductive layer 51a, and is formed near an upper portion of the other member of the pair of memory columnar semiconductor layer 44. Multiple source side conductive layers 51a and drain side conductive layers 51b are formed so that they extend in the row direction with a set pitch in the column direction. Source side conductive layer 51a and the drain side conductive layer 51b are composed of, for example, polysilicon (poly-Si).

The select transistor layer 50 contains source side gate insulating layer 53a, source side columnar semiconductor layer 54a, drain side gate insulating layer 53b, and drain side columnar semiconductor layer 54b. The source side columnar semiconductor layer 54a functions as the body (channel) for the source select transistor (SSTr). The drain side columnar semiconductor layer 54b functions as the body (channel) for the drain select transistor SDTr.

The source side gate insulating layer 53a is placed between source side conductive layer 51a and source side columnar semiconductor layer 54a. The source side gate insulating layer 53a is composed of silicon oxide (SiO$_2$), for example. The source side columnar semiconductor layer 54a penetrates source side conductive layer 51a, and extends in a direction perpendicular to substrate 20. The source side columnar semiconductor layer 54a is connected to the side of source side gate insulating layer 53a and an upper surface of one of the pair of memory columnar semiconductor layers 44. The source side columnar semiconductor layer 54a is composed of, for example, polysilicon (poly-Si).

The drain side gate insulating layer 53b is placed between drain side conductive layer 51b and drain side columnar semiconductor layer 54b. The drain side gate insulating layer 53b is composed of silicon oxide (SiO$_2$), for example. The drain side columnar semiconductor layer 54b penetrates the drain side conductive layer 51b, and extends in a direction perpendicular to substrate 20. The drain side columnar semiconductor layer 54b is connected to the side of drain side gate insulating layer 53b and the other upper surface of the pair of the memory columnar semiconductor layers 44. The drain side columnar semiconductor layer 54b is composed of, for example, polysilicon (poly-Si).

The interconnect layer 60 has source line layer 61, bit line layer 62, and plug layer 63. The source line layer 61 functions as the source line (SL) and the bit line layer 62 functions as the bit line (BL). Source line layer 61 contacts an upper surface of source side columnar semiconductor layer 54a, and extends longitudinally in the row direction. Bit line layer 62, contacts plug layer 63, which in turn contacts the upper surface of drain side columnar semiconductor layer 54b, and extends longitudinally in the column direction. Source line layer 61, bit line layer 62, and plug layer 63 may be composed of, for example, metals such as tungsten.

Next, by reference to FIG. 4, the composition of the word line contact area 70 is described. Back gate conductive layer 31, word line conductive layers 41a-41h, and source side conductive layer 51a (or drain side conductive layer 51b) extend to word line contact area 70. These elements are formed as steps so that the ends of each layer in the row direction form a stair step configuration, as shown in FIG. 4. The positions of the stair-stepped ends of these elements compose a stepped area (ST). Also, within the stepped area (ST) is columnar contact layer 71 that connects individual elements within the stepped area (ST) to lead-out wiring 72. The upper surfaces of columnar contact layers 71 contact lead-out wirings 72, which extend in a direction parallel to the substrate 20. Lead-out wiring 72 is depicted as a single layer in FIG. 4, but may comprise individual wires as necessary.

Figure 5:
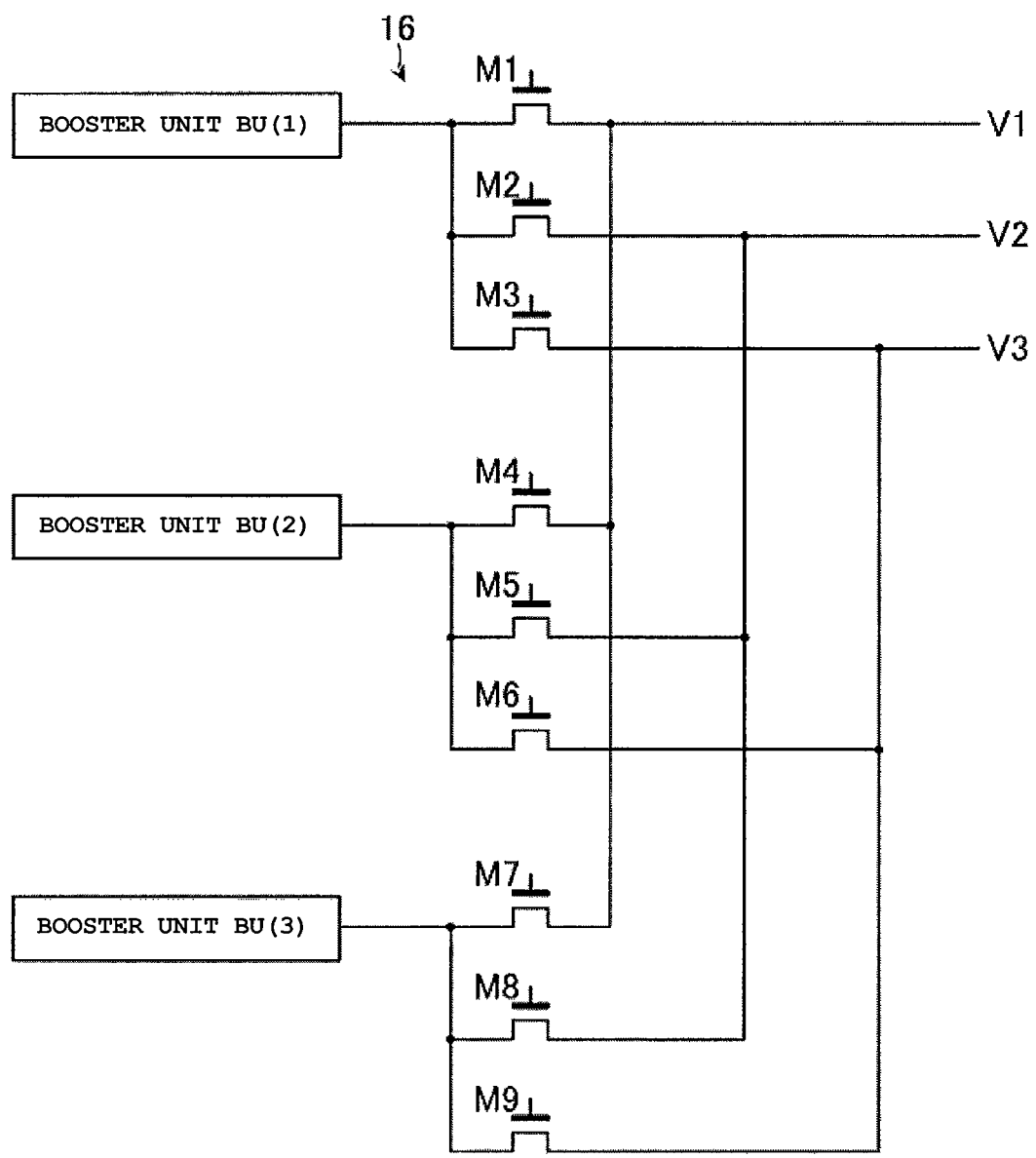
FIG. 5 is a block diagram that shows a booster circuit of the first embodiment.

Next, booster circuit 16 as it pertains to the first embodiment is described by reference to FIG. 5. Booster circuit 16 comprises booster units BU (1)-BU (3) which produce the boosting voltage. However, FIG. 5 is just one possible example embodiment and the number of booster units (BU) is not limited to 3.

Booster units BU (1), BU (2), BU (3) are electrically connected to terminal V1 via the transistors M1, M4, and M7, respectively. Booster units BU (1), BU (2), and BU (3) are electrically connected to the terminal V2 via the transistors M2, M5, and M8, respectively. Booster units BU (1), BU (2), and BU (3) are electrically connected to the terminal V3 via the transistor M3, M6, and M9, respectively.

The control circuit 18 controls the conduction state of transistor M1-M9, and regulates the voltages that are supplied to terminals V1-V3 from the booster units BU (1)-BU (3). For example, the capacity of the word lines WL1-WL16 fluctuates in response to the various actions against the memory cell array 11, it may control the conduction state of the transistors M1-M9 in response to this.

Figure 6:
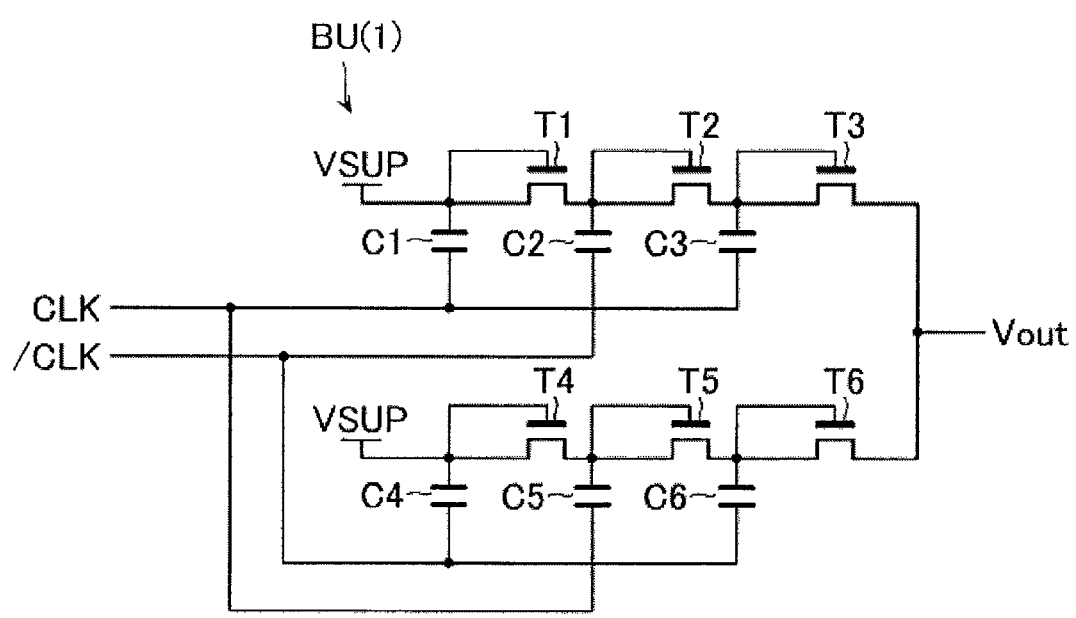
FIG. 6 is a circuit diagram that shows the booster unit of the first embodiment.

In FIG. 6, a design of booster unit BU (1) is depicted. Booster units BU (2) and BU (3) may have the same design as the depicted booster unit BU (1) and need not be specifically described.

Booster unit (BU) 1 produces a voltage Vout that is higher than the supply voltage (VSUP) by utilizing the charge and discharge of a capacitor (capacitative element). The booster unit BU(1) has transistors T1-T6 and capacitors C1-C6. However, this number of transistors and capacitors is just an example and the actual numbers may be more or less.

Each of transistors T1-T6 are diode connected and function as a diode (rectifier cell). The group of transistors T1-T3 is series-connected, as is the group T4-T6. The drain of the transistors T1 and T4 are supplied with the voltage VSUP.

One end of each of capacitors C1, C3, and C5 receives a clock signal CLK (or /CLK). And one end of each of capacitors C2, C4, and C6 receive the complementary clock signal /CLK (or CLK). The other ends of the capacitors C1-C6 are connected to the drain (one end of the rectifier cell) of corresponding transistors T1-T6. Capacitors C1-C6, supplied with the complementary clock signal CLK and /CLK, repeatedly charge and discharge, and this produces a voltage Vout that is higher than the voltage VSUP.

Next, a specific structure of a booster unit BU (1) is described by reference to FIGS. 7A and 7B. The booster unit BU (1) comprises conductive layers 81a-81g, interconnect layer 82, and plug layer 83. Capacitors C1, C3, and C5 are formed by the capacitance (capacity) between the conductive layers 81a-81g. The conductive layers 81a-81g are arrayed perpendicularly to the substrate 20 with a set pitch. The ends of conductive layers 81a-81g compose a stepped area STa that is formed in a stair step pattern such that the positions of the layer ends in the row direction are do not overlap each other. The conductive layers 81a-81g are formed in the same layer as the word line conductive layers 41a-41g. The conductive layers 81a-81g are composed of, for example, polysilicon (poly-Si). While not specifically depicted in FIG. 7A, there is an interlaminar insulating layer between each of the conductive layers 81a-81g. This interlaminar insulating layer between the conductive layers 81a-81g is in the same layer as the interlaminar insulating layer 45 within the memory block (MB), and, like the interlaminar insulating layer 45, may be composed of silicon oxide (SiO$_2$), for example.

Interconnect layer 82 is formed above conductive layers 81a-81g. The interconnect layer 82 extends longitudinally in the column direction and is formed in a striped fashion with a set pitch in the row direction. Plug layer 83 connects interconnect layer 82 to each of the conductive layers 81a-81g in the stepped area STa individually.

Conductive layers 81a, 81c, 81e, and 81g are positioned in the odd numbered layers and are supplied with the clock signal CLK via plug layer 83 and interconnect layer 82. On the other hand, conductive layers 81b, 81d, 81f are positioned in the even numbered layers and each is individually connected to a drain (one end of the rectifier cell) of one of transistors T1, T3, or T5 via plug layer 83 and interconnect layer 82.

Capacitor C1 of the booster unit BU (1) is composed of the capacity C1a (between conductive layer 81a and conductive layer 81b) and the capacity C1b (between conductive layer

81b and conductive layer 81c). Capacitor C3 is composed of the capacity C3a (between conductive layer 81c and conductive layer 81d) and the capacity C3b (between conductive layer 81d and conductive layer 81e). The capacitor C5 is composed of the capacity C5a (between conductive layer 81e and conductive layer 81f) and the capacity C5b (between conductive layer 81f and conductive layer 81g).

Figure 7A:
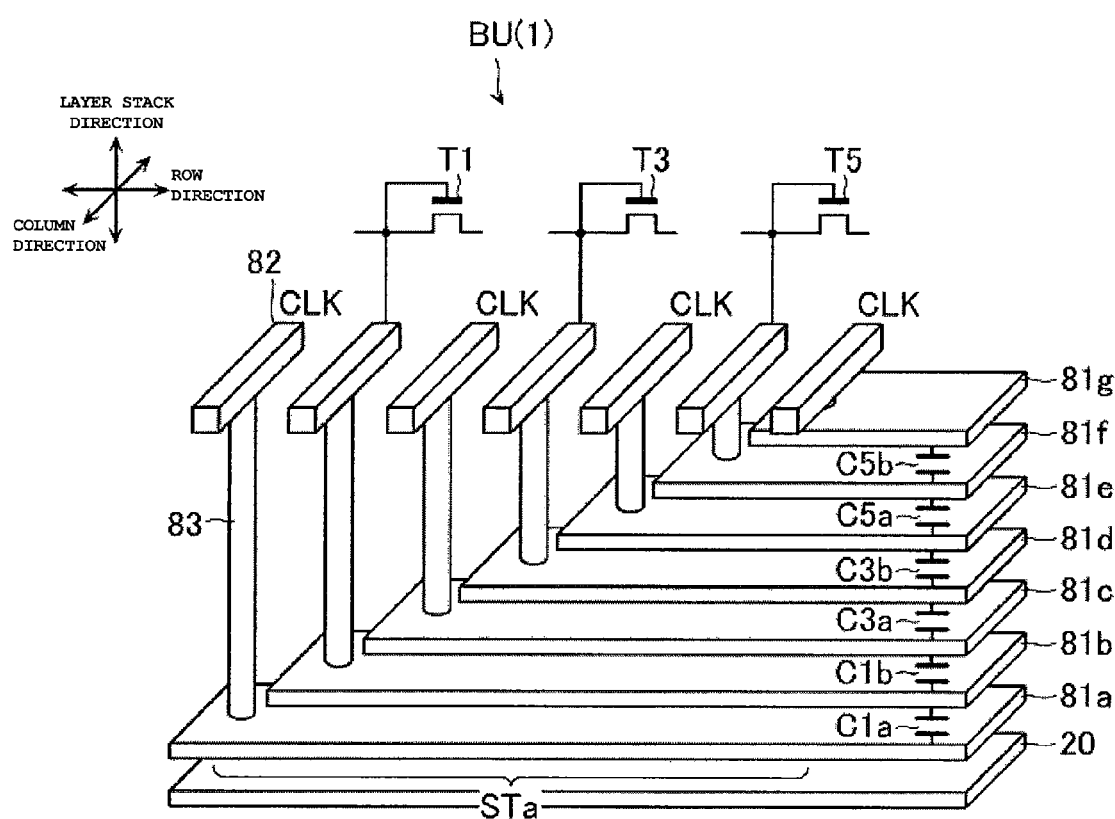
FIG. 7A is a perspective that shows the booster unit of the first embodiment.
Figure 7B:
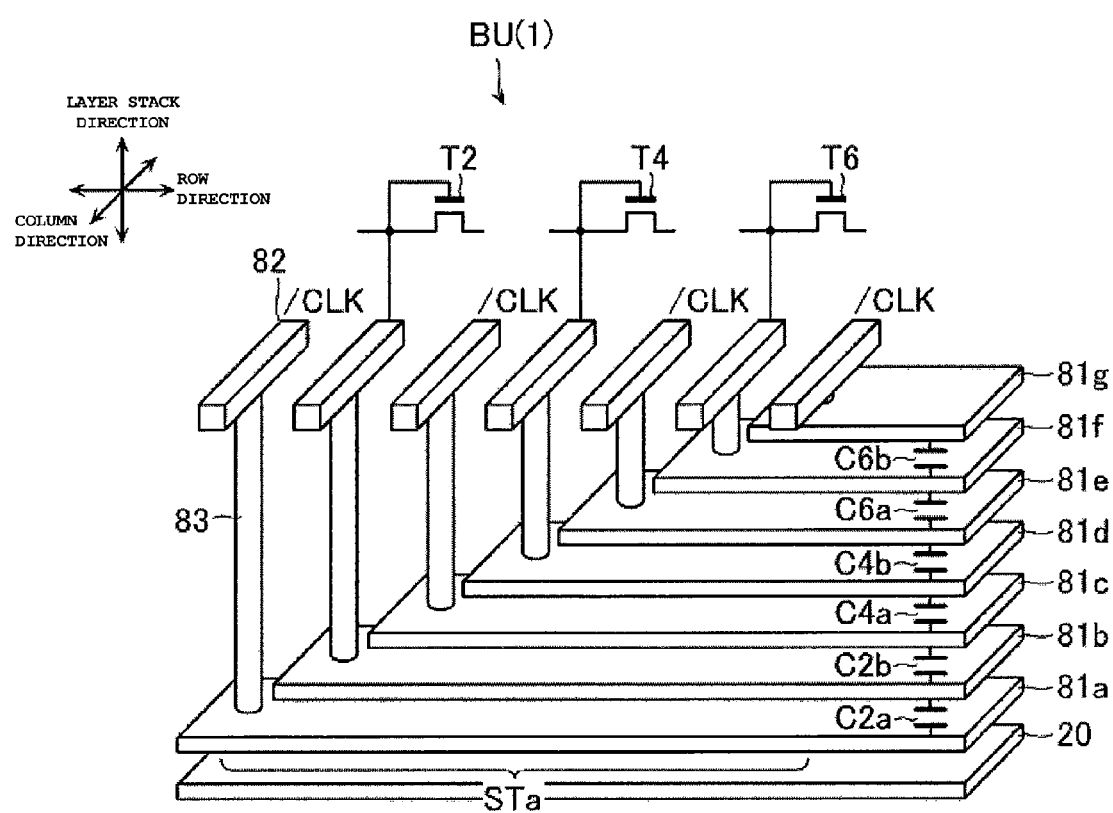
FIG. 7B is a perspective that shows the booster unit of the first embodiment.

Next, with reference to FIG. 7B, the structure of the capacitors C2, C4, and C6 are described. Capacitors C2, C4, and C6 in the booster unit BU (1) are composed of the capacities between conductive layers 81a-81g. Booster unit BU (1) possesses the same general structure as FIG. 7A. However, the conductive layers 81a, 81c, 81e, and 81g in odd numbered layers are supplied with the complementary clock signal /CLK via plug layer 83 and interconnect layer 82. Each of conductive layers 81b, 81d, and 81f even numbered layers are individually connected to the drain (one end of the rectifier cell) of a transistor T2, T4, or T6, via the plug layer 83 and interconnect layer 82.

Capacitor C2 is composed of the capacity C2a (between conductive layer 81a and conductive layer 81b) and capacity C2b (between conductive layer 81b and conductive layer 81c). Capacitor C4 is composed of the capacity C4a (between conductive layer 81c and conductive layer 81d) and the capacity C4b (between conductive layer 81d and conductive layer 81e). Capacitor C6 is composed of the capacity C6a (between conductive layer 81e and conductive layer 81f) and the capacity C6b (between conductive layer 81f and conductive layer 81g).

As can be seen in FIG. 7A, individual capacitors C1, C3, and C5 can be formed using conductive layers 81a-81g. An individual capacitor C1, C2, or C3 may consist of more than one adjacent layer 81a-81g in a stacked arrangement. Similarly, as shown in FIG. 7B, individual capacitors C2, C4, and C6 can also be formed using conductive layers 81a-81g in a stacked arrangement. By using a stacked arrangement, as depicted in FIGS. 7A and 7B, capacitors C1-C6 may be formed using smaller dimensions and less occupied die area than if the capacitors were formed separately in a non-stacked arrangement.

Embodiment 2

Figure 8:
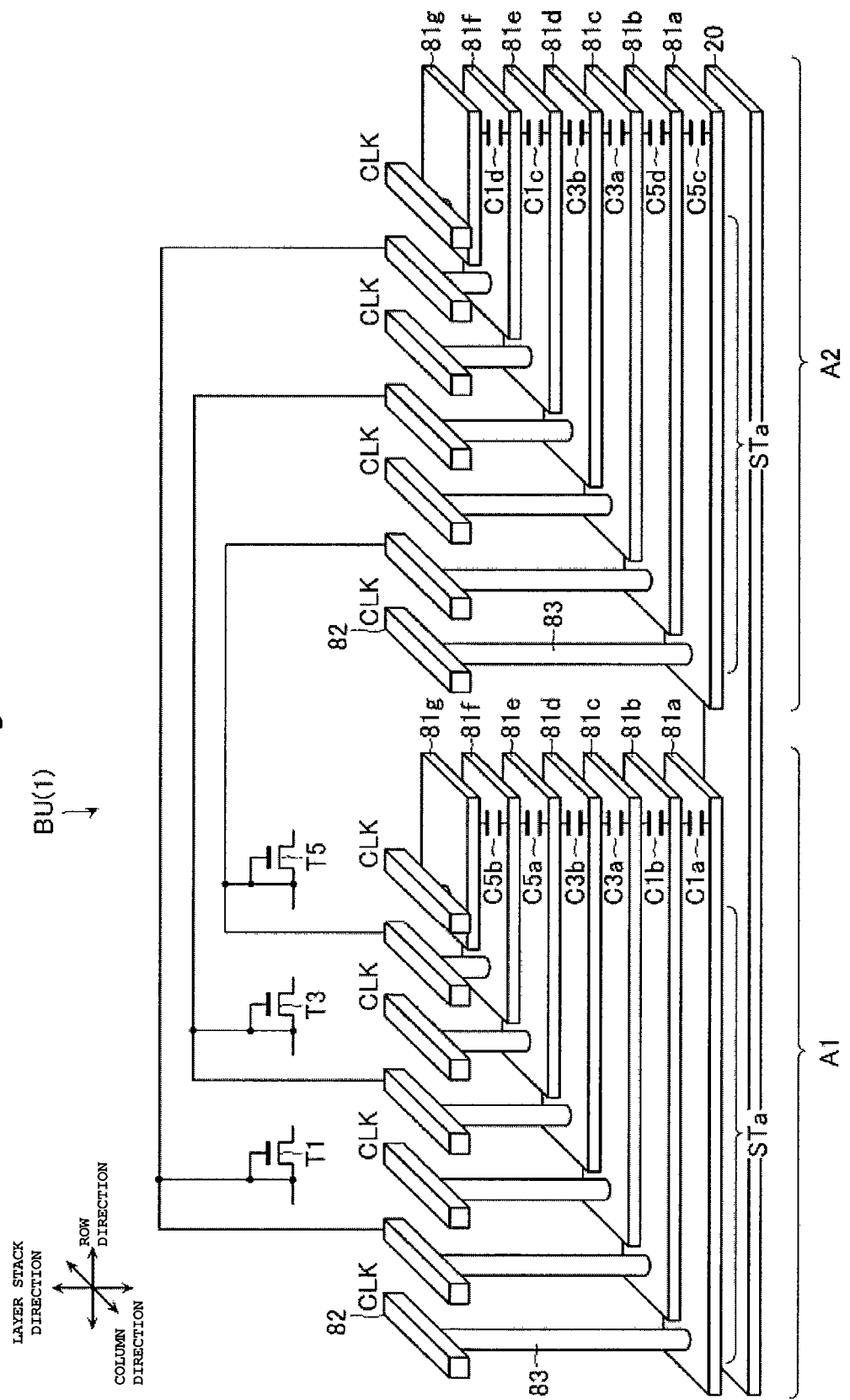
FIG. 8 is a perspective that shows a booster unit of a second embodiment.

The second embodiment, similar to the first embodiment, has a memory cell array 11 and its peripheral circuits 12-18. However, conductive layers 81a-81g that are used to form capacitors C1, C3, and C5 inside the booster unit BU (1) are formed using two domains of stacked conductive layers. As shown in FIG. 8, capacitors C1, C3, and C5 may consist of layers in both domains A1 (first domain) and domain A2 (second domain) on the substrate 20. In contrast to the first embodiment in which capacitors C1, C3, and C5 were formed in only a single stacked domain, these capacitors may be formed using two separate stacked domains. The general formation and composition of each separate domain is equivalent to the other domain and to the single domain of the first embodiment, so it need not be repeated again in detail.

In the stacked domain of the first embodiment (and in the individual domains A1 and A2 of the second embodiment) conductive layers 81a-81g compose a stepped area STa in which the layers are arrayed in a stair-step pattern, such that layers ends do not overlap one another. But because layer length (in the row direction) decreases with each step up the layer domain, the facing areas of adjacent contiguous layers also decreases with each step up. Thus, while layers 81a and 81b overlap one another for the entire length of layer 81b, layers 81f and 81g overlap for only the length of layer 81g, which may be significantly less than the length of 81b given the stair-stepped arrangement of layers 81a-81g. These uneven overlaps may result in the capacities of capacitors C1, C3, and C5 formed from these layers becoming uneven if, as in the first embodiment, the capacitors consist of only layers in a single stacked domain.

Therefore, to make the capacities of the capacitors C1, C3, and C5 even, conductive layers 81a-81g may be arranged in a stepped area STa at each of the domains A1 and A2. And then the transistors (T1, T3, and T5) may be connected as shown in FIG. 8 to even numbered conductive layers 81b, 81d, and 81f. For example, the drain (one end of the rectifier call) of transistor T1 may be connected to layer 81b in domain A1 and layer 81f in domain A2. Transistor T3 would similarly then be connected to layer 81d in domain A1 and layer 81d in domain A2. And transistor T5 would connect to layer 81f in domain A1 and layer 81b in domain A2. Connections between transistor drain and the conductive layers would be via plug layer 83 and interconnect layer 82. Conductive layers 81a, 81c, 81e and 81g (which are considered the odd numbered layers) are supplied with the clock signal CLK via the plug layer 83 and the interconnect layer 82.

When connected as described above, capacitors C1, C3, and C5, are composed of the capacities between conductive layers 81a-81g in domains A1 and A2.

Capacitor C1 is composed of the capacities C1a between conductive layer 81a and conductive layer 81b in domain A1, the capacity C1b between conductive layer 81b and conductive layer 81c in domain A1, the capacity C1c between conductive layer 81e and conductive layer 81f in domain A2, and the capacity C1d between conductive layer 81f and conductive layer 81g in domain A2.

Capacitor C3 is composed of the capacity C3a between conductive layer 81c and conductive layer 81d in domain A1, the capacity C3b between conductive layer 81d and conductive layer 81e in domain A1, the capacity C3a between conductive layer 81c and conductive layer 81d in domain A2, and the capacity C3b between conductive layer 81d and conductive layer 81e in domain A2.

Capacitor C5 is composed of the capacity C5a between conductive layer 81e and conductive layer 81f in domain A1, the capacity C5b between conductive layer 81f and conductive layer 81g in domain A1, the capacity C5c between conductive layer 81a and conductive layer 81b in domain A2, and the capacity C5d between conductive layer 81b and conductive layer 81c in domain A2.

Due to the stair-step arrangement of stepped area STa within domains A1 and A2 which causes the overlapping/facing area between the adjacent conductive layers 81a-81g to decrease from bottom to top of the layer stack the capacity (C1a-C5d) between conductive layers decreases from bottom to top of the stack. The relative capacity of C1a-C5d is:

$$C1a > C1b > C3a > C3b > C5a > C5b$$

$$C5c > C5d > C3a > C3b > C1c > C1d$$

Thus, the relative capacities of capacitors C1, C3, and is:

Capacitor C1 (composed of capacities C1a+C1b+ C1c+C1d)≈capacitor C3 (composed of capacities C3a+C3b+C3a+C3b)≈the capacity of Capacitor C5 (composed of capacities C5a+C5b+C5c+ C5d)

Capacitors C2, C4, and C6 would be similarly formed and composed as shown for capacitors C1, C3, and C5 in FIG. 8 (though C2, C4, and C6 would be supplied the complementary clock signal /CLK). The second embodiment achieves similar results to the first embodiment while providing more balanced capacity in capacitors C1, C3, and C5.

Embodiment 3

The third embodiment has the same memory cell array 11 and peripheral circuits 12-18 as the first embodiment. However, in the third embodiment, the booster unit BU (1) is, as shown in FIG. 9, composed of 13 conductive layers (conductive layers 81a-81m) rather than the 7 conductive layers (conductive layers 81a-81g) described for the first embodiment. Other than adding more conductive layers the general formation and composition of third embodiment is similar to the first embodiment and need not be explained again in detail.

The arrangement of the third embodiment, like the second embodiment, makes the capacities of capacitors C1, C3, and C5 even (or approximately even). Conductive layers 81a-81m, as shown in FIG. 9, composes the stepped area STb wherein the conductive layers 81a-81m are formed in a stair-stepped pattern such the ends of layers 81a-81m do not overlap one another in the row direction. The conductive layer stack is divided into two domains with the layers below layer 81g forming domain A3 and the layers above layer 81g forming domain A4. As shown in FIG. 9, the connections of the transistor are reversed between domain A3 (third domain) and domain A4 (fourth domain). Thus, within domain A3 the conductive layers 81b, 81d, and 81f (even numbered layers) are individually connected to the drain (one end of the rectifier cell) of transistors T1, T3, and T5, such that transistor T1 is connected to conductive layer 81b, transistor T3 is connected to conductive layer 81d, and transistor T5 is connected to conductive layer 81f. In domain A4, the conductive layers 81l, 81j, and 81h (even numbered layers) are connected to the drain (one end of the rectifier cell) of the transistors T1, T3, and T5, such that transistor T1 is connected to conductive layer 81l, transistor T3 is connected to conductive layer 81j, and transistor T5 is connected to conductive layer 81h. While not shown in FIG. 9, it is to be understood that there is an interlaminar insulating layer between each of the conductive layers 81a-81m. Conductive layers 81a, 81c, 81e, 81g, 81i, 81k, 81m (odd numbered layers) are supplied with the clock signal CLK via the plug layer 83 and the interconnect layer 82.

With the connection relationship depicted in FIG. 9, each of the capacitors C1, C3, and C5, is composed of capacities between conductive layers 81a-81g and conductive layers 81g-81m in domains A3 and A4.

Capacitor C1, is composed of the capacity C1a between conductive layer 81a and conductive layer 81b, the capacity C1b between conductive layer 81b and conductive layer 81c, the capacity C1e between conductive layer 81k and conductive 81l, and the capacity C1f between conductive layer 81l and conductive layer 81m.

Capacitor C3 is composed of the capacity C3a between conductive layer 81c and conductive layer 81d, the capacity C3b between conductive layer 81d and conductive layer 81e, the capacity C3e between conductive layer 81i and conductive layer 81j, and the capacity C3f between conductive layer 81j and conductive layer 81k.

Capacitor C5 is composed of the capacity C5a between conductive layer 81e and conductive layer 81f, the capacity C5b between conductive layer 81f and conductive layer 81g, the capacity C5e between conductive layer 81g and conductive layer 81h, and the capacity C5f between conductive layer 81h and conductive layer 81i.

Because of the stair-stepped arrangement of stepped area STb, the overlap between layers 81a and 81b may be significantly greater than the overlap between layers 81l and 81m, because the facing/overlapping area between the adjacent conductive layers 81a-81m decreases as the layers move up the stack. Decreasing overlap decreases the relative capacity between the layers. The relative capacities C1a-C5f is:

C1a>C1b>C3a>C3b>C5a>C5b>C5e>C5f>C3e>C3f>C1e>C1f

Which, when configured as depicted in FIG. 9, leads the relative capacities of C1, C3, and C5 to be:

Capacitor C1 (composed of capacities C1a+C1b+C1e+C1f)≈Capacitor C3 (composed of capacities C3a+C3b+C3e+C3f)≈Capacitor C5 (composed of capacities C5a+C5b+C5e+C5f)

As can be seen, the third embodiment achieves a stacked arrangement of capacitors similar to the first embodiment while providing more even or balanced capacities in capacitors C1, C3, and C5. Therefore, the third embodiment achieves similar results to the first embodiment while providing more balanced capacity in capacitors C1, C3, and C5.

While FIG. 9 specifically depicts only the laminate structure of capacitors C1, C3, and C5, capacitors C2, C4, and C6 may be composed in a similar structure to achieve the same effect.

Embodiment 4

Figure 10A:
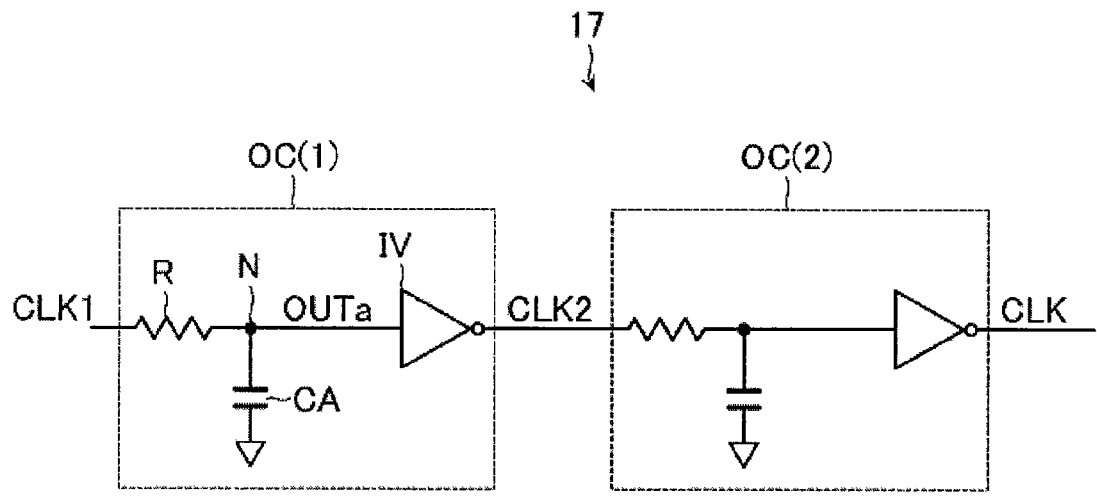
FIG. 10A is a circuit diagram that shows an oscillating circuit of a fourth embodiment.

The fourth embodiment has a memory cell array 11 and its peripheral circuitries 12-18 similar to the first embodiment. However, in the fourth embodiment, oscillating circuit 17 has the oscillating units OC (1) and OC (2), as depicted in FIG. 10A. Oscillating units OC (1) and OC (2) may be composed of the laminate structure shown in FIG. 11. In all other respects, the fourth embodiment may be similar to the previously described embodiments and detailed explanations of those portions are omitted for sake of brevity. Also, the embodiment depicted in FIG. 10A is only one example and the number of the oscillating unit (OC) in the oscillating circuit 17 is not limited to 2.

In this fourth embodiment, oscillating unit OC (1) is provided with the clock signal CLK1 and outputs a clock signal CLK2, which has a different frequency than the clock signal CLK1. Oscillating unit OC (1) outputs clock signal CLK2 to oscillating unit OC (2). Oscillating unit OC (2) outputs a clock signal CLK that has a different frequency than the clock signals CLK1 and CLK2. Clock signal CLK is fed from oscillating unit OC(2) to booster units BU (1)-BU (3).

Next, we explain about the structure inside the oscillating unit OC (1). Since the oscillating unit OC (2) possesses a similar composition to the oscillating unit OC (1) it need not be separately described. Oscillating unit OC (1) comprises a resistor (R), capacitor (CA), and inverter (IV). Resistor (R) and capacitor (CA) are series-connected. One end of resistor (R) is supplied with clock signal CLK1 and the other end of resistor (R) is connected to one end of capacitor (CA) at node (N). The other end of capacitor (CA) is connected to ground and is supplied with the ground voltage (Vss). The input terminal of inverter (IV) is supplied with the signal OUTa from node (N) and the output terminal of the inverter (IV) outputs clock signal CLK2.

Figure 10B:
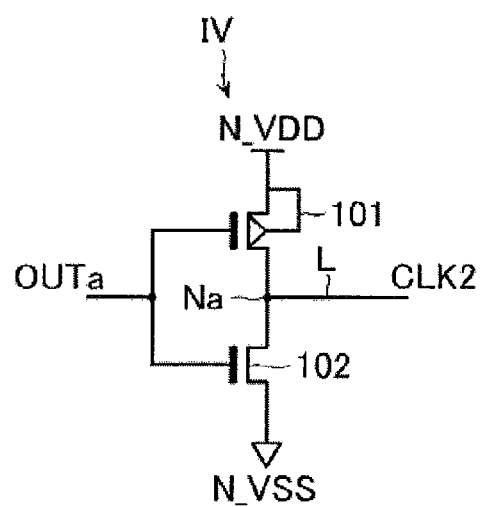
FIG. 10B is a circuit diagram that shows an inverter of the fourth embodiment.

Inverter (IV), as shown in FIG. 10B, is composed of a CMOS inverter that has a PMOS transistor 101 and a NMO transistor 102 that are series-connected between the supply terminal (N_VDD) and the ground terminal (N_VSS). Signal OUTa is supplied to the gate of PMOS transistor 101 and the gate of NMO transistor 102, and clock signal CLK2 is outputted via interconnect (L) from node (Na) between PMOS transistor 101 and NMO transistor 102.

Next, the laminate structure of oscillating unit OC (1) is described by reference to FIG. 11. Since the laminate structure of the oscillating unit OC (2) is similar to the oscillating unit OC (1) it need not be separately described.

Figure 11:
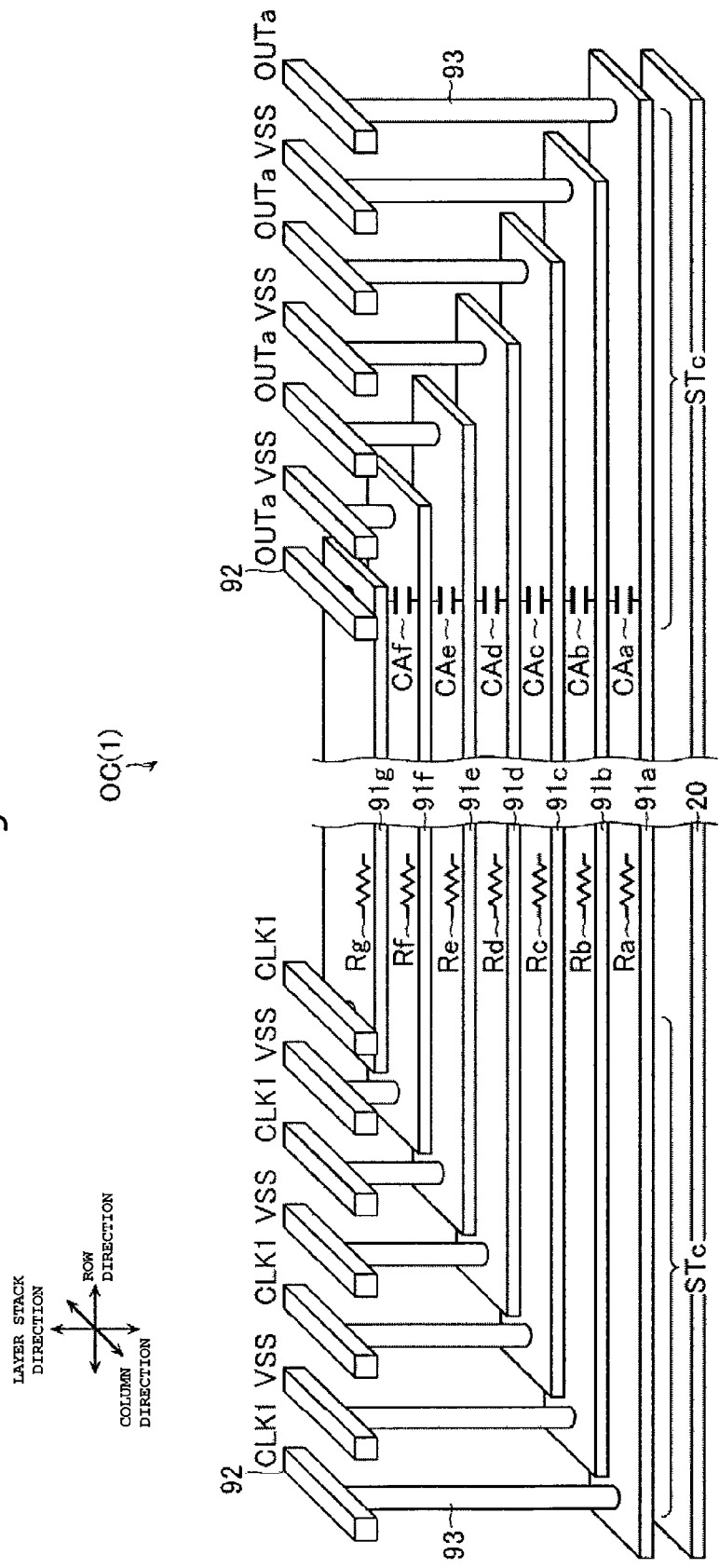
FIG. 11 is a perspective that shows the oscillating unit of the fourth embodiment.

As shown in FIG. 11, the oscillating unit OC (1) has conductive layers 91a-91g, interconnect layer 92, and plug layer 93. Resistor (R) in oscillating unit OC (1) is composed of the interconnect resistance of the conductive layers 91a-91g and capacitor (CA) is composed of the capacity between conductive layers 91a-91g.

Conductive layers 91a-91g are arrayed with a set pitch perpendicularly to substrate 20. The conductive layers 91a-91g, composes a stepped area (STc) arranged in a stair-stepped pattern (as shown in FIG. 11) so that the positions of layer ends in the row direction do not overlap on both ends the layer in the row direction. Conductive layers 91a-91g are formed in the same layer as the word line conductive layers 41a-41g. Conductive layers 91a-91g are composed of, for example, polysilicon (poly-Si). While not shown in FIG. 11, an interlaminar insulating layer is placed between each of the conductive layers 91a-91g. This interlaminar insulating layer between the conductive layers 91a-91g is placed in the same layer as the interlaminar insulating layer 45 in the memory block (MB), and like the interlaminar insulating layer 45, is composed of, for example, silicon oxide ($SiO_2$).

Interconnect layer 92 is formed above conductive layers 91a-91g. The interconnect layer 92 extends in the column direction, and is placed in a striped fashion with a set pitch in the row direction. The plug layer 93 in the stepped area STc connects interconnect layer 92 and conductive layers 91a-91g.

Conductive layers 91a, 91c, 91e, 91g (the odd-numbered layers) are supplied with the clock signal CLK1 via plug layer 93 and interconnect layer 92 at one end of the layer stack (the left side in FIG. 11) in the row direction.

Conductive layers 91b, 91d, 91f (the even numbered layers) are supplied with the ground voltage (VSS) via the plug layer 93 and interconnect layer 92 at one end of the layer stack (the left side in FIG. 11) in the row direction.

Conductive layers 91a, 91c, 91e, and 91g (the odd numbered layers) output signal OUTa via the plug layer 93 and the interconnect layer 92 at the other end of the layer stack (the right side in FIG. 11) in the row direction.

And conductive layers 91b, 91d, and 91f (the even numbered layers) are supplied with the ground voltage (VSS) via the plug layer 93 and the interconnect layer 92 on the other end of the layer stack (the right side in FIG. 11) in the row direction.

With the supply of clock signal CLK1 and ground voltage VSS, resistor (R) of oscillating unit OC (1) is composed of the interconnect resistors Ra-Rg of conductive layers 91a-91g. The capacitor (CA) of oscillating unit OC (1) is composed of the capacity CAa-CAf between the conductive layers 91a-91g.

By forming capacitor (CA) and resistor (R) from the layer stacked conductive layers 91a-91g the die area occupied by capacitor (CA) and resistor (R) may be reduced for oscillating units OC (1) and OC (2).

Embodiment 5

Figure 12:
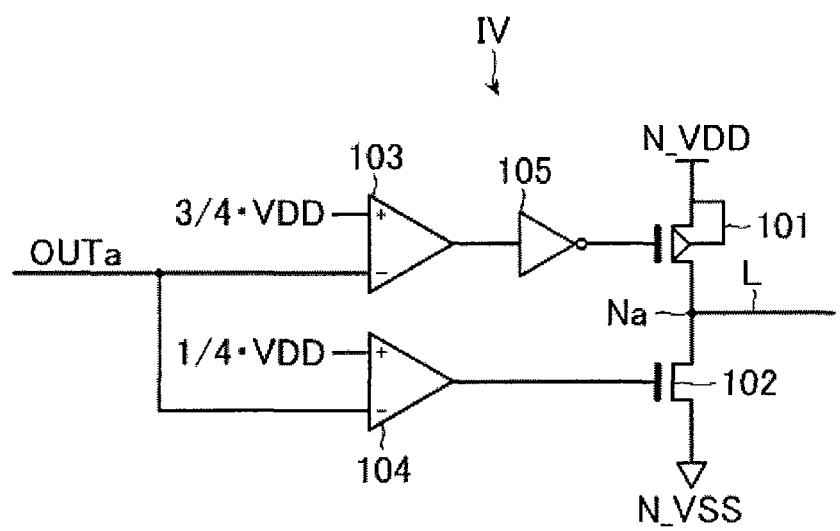
FIG. 12 is a circuit diagram that shows an inverter of a fifth embodiment.

The fifth embodiment has the same memory cell array 11 and peripheral circuits 12-18 as the first embodiment. As depicted in FIG. 12, it also has oscillating units OC (1) and OC (2) similar to the fourth embodiment, but inverter IV in the oscillating units OC (1) and OC (2) has added components: comparators 103, 104, and inverter 105. Except for the addition of these components, the fourth embodiment and the fifth embodiment are the same so a detailed description is unnecessary With inverter (IV) arrangement of the fourth embodiment, there may be a case where transistors 101 and 102 conduct at the same time, which may cause the clock signal CLK not to be formed in the desired waveform. To solve this problem, the inverter (IV) of the fifth embodiment, as shown in FIG. 12, has comparators 103, 104, and inverter 105.

A first input terminal of the comparator 103 is supplied with first voltage (for example a voltage ¾·VDD), and a second input terminal is supplied with the signal OUTa. The output terminal of comparator 103 is electrically connected to the gate of PMOS transistor 101 via inverter 105. A first input terminal of the comparator 104 is supplied with second voltage (for example a voltage ¼·VDD), and its second input terminal is supplied with signal OUTa. The output terminal of comparator 104 is electrically connected to the gate of NMOS transistor 102. When connected in this manner, transistors 101 and 102 will not both be in a conduction state at the same time. Therefore, the fifth embodiment, when compared to the fourth embodiment, can shape the clock signal CLK into the desired waveform. Otherwise, the fifth embodiment achieves the same effect as the first and the fourth embodiments.

Embodiment 6

Figure 13:
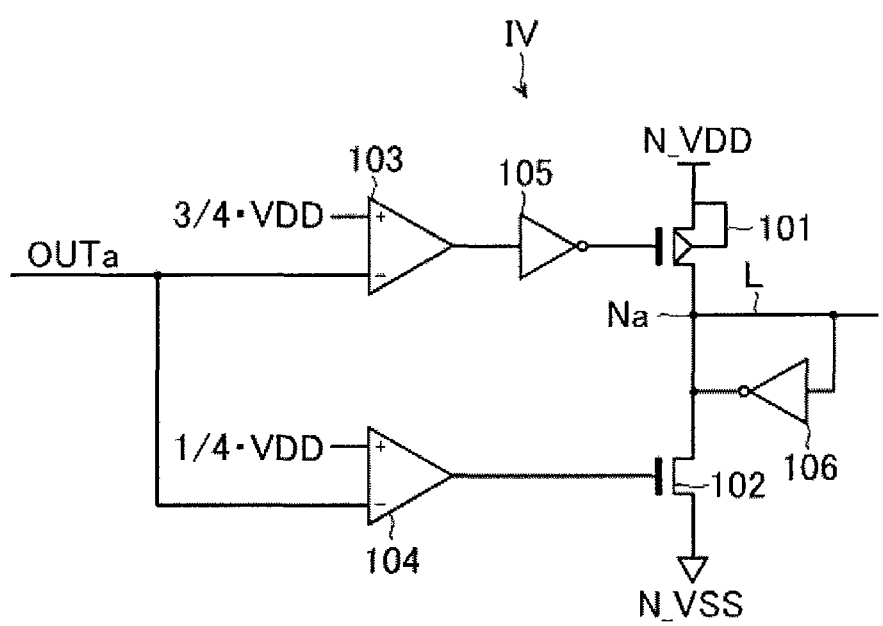
FIG. 13 is a circuit diagram that shows an inverter of a sixth embodiment.

The sixth embodiment has the memory cell array 11 and its peripheral circuits 12-18 as described for the first embodiment. Also, the sixth embodiment includes the same oscillating units OC (1) and OC (2) as described for the fifth embodiment. However, in the sixth embodiment as depicted in FIG. 13, the inverter (IV) of the oscillating units OC (1) and OC (2) includes inverter 106 in addition to the components of the fifth embodiment. Excepting for this addition of inverter 106, the fifth embodiment and the sixth embodiment are the same and it is unnecessary to provide a detailed description of the components of the fifth embodiment again.

As shown in FIG. 13, the input terminal of inverter 106 is connected to interconnect (L), and the output terminal of inverter 106 is connected to the drain of the NMOS transistor 102. With the addition of inverter 106, the sixth embodiment can suppress noise in the output signal of the inverter (IV). Otherwise, the sixth embodiment achieves the same effect as the first and the fifth embodiments.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

For example, in the first and the second embodiments, conductive layers 81b, 81d, 81f (the even numbered layers) may be supplied with clock signal CLK and conductive layers 81a, 81c, 81e, and 81g (the odd numbered layers) may be connected to the drain of transistors T1, T3, and T5.

Or, in the third embodiment, conductive layers 81b, 81d, 81f, 81h, 81j, and 81l (the even numbered layers), may be supplied with the clock signal CLK and conductive layers 81a, 81c, 81e, 81g, 81i, 81k, and 81m (the odd numbered layers) may be connected to the drain of transistors T1, T3, and T5.

Or, in the fourth embodiment, one end of conductive layers 91b, 91d, 91f (the even numbered layers) may be supplied with clock signal CLK1 and one end of conductive layers 91a, 91c, 91e, 91g (the odd numbered layers) may be supplied with ground voltage (VSS).

What is claimed is:

1. A semiconductor device, comprising:
a booster circuit for supplying peripheral circuits of a memory cell array with an output voltage higher than an input voltage, the booster circuit comprising one or more booster units, each booster unit connected to a plurality of transistors, each transistor connected to a booster circuit output terminal;
the booster unit comprising:
a first set of capacitors, a first member of the first set of capacitors having a first end supplied with a supply voltage and a second end supplied with a first clock signal;
a first set of transistors including first and second transistors, the gate and drain of each first set transistor electrically connected to the first end of a corresponding member of the first set of capacitors, with each transistor of the first set connected in series as diodes, with the drain and gate of a first member of the first set of transistors connected to the supply voltage, and the source of a last member of the first set of transistors connected to a booster unit output terminal;
a second set of capacitors, a first member of the second set of capacitors having a first end supplied with the supply voltage and a second end supplied with a second clock signal, the second clock signal complementary to the first clock signal;
a second set of transistors including third and fourth transistors, the gate and drain of each second set transistor electrically connected to the first end of a corresponding member of the second set of capacitors, with each transistor of the second set connected in series as diodes, with the drain and gate of a first member of the second set of transistors connected to the supply voltage, and the source of a last member of the second set of transistors connected to the booster unit output terminal;
each of the first and second sets of capacitors of the booster unit formed in a layer stacked configuration, wherein a plurality of conductive layers are stacked with insulating layers in a stair-stepped configuration above a substrate, such that at least one end of each conductive layer is not overlapped by the conductive layer directly above, and includes first and second conductive layers that are each a first distance away from the substrate, the first conductive layer electrically connected to a gate of the first transistor and the second conductive layer electrically connected to a gate of the second transistor, and third and fourth conductive layers that are each a second distance, greater than the first distance, away from the substrate, the third conductive layer electrically connected to a gate of the third transistor and the fourth conductive layer electrically connected to a gate of the fourth transistor.

2. The semiconductor device of claim 1, further comprising: an electrical connection to at least one end of a conductive layer that is not overlapped by the conductive layer directly above.

3. The semiconductor device of claim 1, further comprising: an oscillator circuit, the oscillator circuit comprising, one or more oscillator units, the oscillator units each comprising:
a resistor with a first and second end,
a capacitor with a first and second end, and
an inverter with a first and second end, wherein the first end of the resistor is supplied with a third clock signal, the second end of the resistor is connected to the second end of the capacitor and the first end of the inverter, the first end of the capacitor is connected to a ground voltage, and the second end of the inverter outputs a fourth clock signal.

4. The semiconductor device of claim 3, wherein the resistor and the capacitor are formed in a layer stacked configuration, wherein a plurality of conductive layers are stacked with insulating layers in a stair-stepped configuration, such that the ends of each conductive layer are not overlapped by the conductive layer directly above.

5. The semiconductor device of claim 1, wherein the layer stacked configuration comprises more than one layer stack domain.

6. The semiconductor device of claim 5, wherein the layer stack domains are arrayed in the same horizontal plane.

7. The semiconductor device of claim 5, wherein the layer stack domains are arrayed in the same vertical plane.

8. The semiconductor device of claim 5, wherein at least one capacitor of the first or second capacitor set is formed using conductive layers in different layer stack domains.

9. The semiconductor device of claim 1, wherein the capacitors of the first set are formed using conductive layers selected to provide matched capacitances in the capacitors of the first set.

10. The semiconductor device of claim 1, wherein capacitors of the second set are formed using conductive layers selected to provide matched capacitances in the capacitors of the second set.

11. The semiconductor device of claim 1, wherein there are three capacitors in the first set of capacitors.

12. The semiconductor device of claim 1, wherein there are three transistors in the first set of transistors.

13. The semiconductor device of claim 1, wherein there are thirteen conductive layers arrayed in the layer stacked configuration.

14. The semiconductor device of claim 1, wherein there are six conductive layers arrayed in the layer stacked configuration.

15. A semiconductor device with a memory cell array, comprising:
a booster circuit, the booster circuit comprising one or more booster units, each booster unit connected to a plurality of transistors, each transistor connected to a booster circuit output terminal, the booster units comprising:
a first set of capacitors, a first member of the first set of capacitors having a first end supplied with a supply voltage and a second end supplied with a first clock signal,
a first set of transistors including first and second transistors, the gate and drain of each first set transistor electrically connected to the first end of a corresponding member of the first set of capacitors, with each transistor of the first set connected in series as diodes with the drain and gate of a first member of the first set of transistors connected to the supply voltage, and the source of a last member of the first set of transistors connected to a booster unit output terminal,
a second set of capacitors, a first member of the second set of capacitors having a first end supplied with the supply voltage and a second end supplied with a second clock signal, the second clock signal complementary to the first clock signal, and a second set of transistors including third and fourth transistors, the gate and drain of each second set transistor electrically connected to the first end of a corresponding member of the second set of capacitors, with each transistor of the second set connected in series as diodes with the drain and gate of a first member of the second set of transistors connected to the supply voltage, and the source of a last member of the second set of transistors connected to the booster unit output terminal, each of the first and second sets of capacitors of the booster unit formed in a layer stacked configuration, wherein a plurality of conductive layers are stacked with insulating layers in a stair-stepped configuration above a substrate, such that at least one end of each conductive layer is not overlapped by the conductive layer directly above, and includes first and second conductive layers that are each a first distance away from the substrate, the first conductive layer electrically connected to a gate of the first transistor and the second conductive layer electrically connected to a gate of the second transistor, and third and fourth conductive layers that are each a second distance, greater than the first distance, away from the substrate, the third conductive layer electrically connected to a gate of the third transistor and the fourth conductive layer electrically connected to a gate of the fourth transistor; and an oscillator circuit, the oscillator circuit having an input terminal and an output terminal, the input terminal connected to a clock signal supplied by a control circuit, and the output terminal of the oscillator circuit connected to an input terminal of the booster circuit, the oscillator circuit comprising one or more oscillator units, each oscillator unit connected in series, the oscillator units each comprising:

a resistor with a first and second end, a capacitor with a first and second end, and a first inverter with a first and second end, wherein the first end of the resistor is supplied with a third clock signal, the second end of the resistor is connected to the second end of the capacitor and the first end of the first inverter, the first end of the capacitor is connected to a ground voltage, and the second end of the first inverter outputs a fourth clock signal.

16. The semiconductor device of claim 15, wherein the oscillator unit further comprises a comparator connected to an input voltage of the first inverter.

17. The semiconductor device of claim 16, wherein the first inverter further comprises a second inverter connected to an output terminal of the comparator.

18. The semiconductor device of claim 17, wherein the first inverter further comprises a third inverter connected to output voltage of the first inverter.

19. The semiconductor device of claim 15, wherein the resistor and capacitor are formed in a layer stacked configuration using a plurality of conductive layers separated by interlaminar insulator layers, the layer stacked configuration having a stair-step arrangement on both ends of the conductive layers.

20. The semiconductor device of claim 19, further comprising an interconnect layer and plug layer connected to individual conductive layers of the layer stacked configuration.

* * * * *